United States Patent
Nakao et al.

(10) Patent No.: US 12,043,916 B2
(45) Date of Patent: Jul. 23, 2024

(54) QUARTZ GLASS CRUCIBLE WITH CRYSTALLIZATION-ACCELERATOR-CONTAINING LAYER HAVING GRADIENT CONCENTRATION

(71) Applicant: SUMCO CORPORATION, Tokyo (JP)

(72) Inventors: Toshiyuki Nakao, Akita (JP); Hiroshi Kishi, Akita (JP); Kouta Hasebe, Akita (JP); Hideki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 147 days.

(21) Appl. No.: 17/790,913

(22) PCT Filed: Oct. 30, 2020

(86) PCT No.: PCT/JP2020/040831
§ 371 (c)(1),
(2) Date: Jul. 5, 2022

(87) PCT Pub. No.: WO2021/140729
PCT Pub. Date: Jul. 15, 2021

(65) Prior Publication Data
US 2023/0077530 A1    Mar. 16, 2023

(30) Foreign Application Priority Data
Jan. 10, 2020    (JP) .................................. 2020-002812

(51) Int. Cl.
| | |
|---|---|
| *C30B 35/00* | (2006.01) |
| *C30B 15/10* | (2006.01) |
| *C30B 29/06* | (2006.01) |

(52) U.S. Cl.
CPC .............. *C30B 15/10* (2013.01); *C30B 29/06* (2013.01); *C30B 35/002* (2013.01)

(58) Field of Classification Search
CPC ......... C30B 15/00; C30B 15/10; C30B 35/00; C30B 35/002; C30B 29/00; C30B 29/02;
(Continued)

(56) References Cited

U.S. PATENT DOCUMENTS

| | | | |
|---|---|---|---|
| 2005/0178319 A1* | 8/2005 | Korus | ........................ C03C 3/06 117/200 |
| 2019/0145019 A1 | 5/2019 | Kishi et al. | |
| 2020/0115820 A1* | 4/2020 | Kishi | ...................... C03B 20/00 |

FOREIGN PATENT DOCUMENTS

| | | |
|---|---|---|
| JP | H082932 A | 1/1996 |
| JP | 2003160393 A | 6/2003 |

(Continued)

OTHER PUBLICATIONS

International Search Report (ISR) mailed Dec. 28, 2020, issued for International application No. PCT/JP2020/040831. (3 pages).

*Primary Examiner* — Kenneth A Bratland, Jr.
(74) *Attorney, Agent, or Firm* — Law Office of Katsuhiro Arai

(57) ABSTRACT

A quartz glass crucible (1) includes: a crucible body (10) made of silica glass; and a crystallization-accelerator-containing layer (13) formed on an outer surface of the crucible body (10). A concentration of a crystallization accelerator contained in the crystallization-accelerator-containing layer (13) is $1.0 \times 10^{13}$ atoms/cm$^2$ or more and $4.8 \times 10^{15}$ atoms/cm$^2$ or less. The quarts glass crucible is intended to be capable of not only enduring a single crystal pulling-up process that takes a very long time, such as multi-pulling, but also stably controlling the oxygen concentration and crystal diameter of a silicon single crystal by eliminating a gap between the carbon susceptor and the crucible as much as possible.

8 Claims, 5 Drawing Sheets

(58) Field of Classification Search
CPC .......... C30B 29/06; F27B 14/00; F27B 14/08;
F27B 14/0843; F27B 14/10; F27B 14/104
USPC ... 117/11, 13, 200, 206, 208, 213, 220, 928,
117/931–932
See application file for complete search history.

(56) References Cited

FOREIGN PATENT DOCUMENTS

| | | | |
|---|---|---|---|
| JP | 2004002083 | A | 1/2004 |
| JP | 2005255488 | A | 9/2005 |
| JP | 2010275151 | A | 12/2010 |
| JP | 2011088776 | A | 5/2011 |
| WO | 2018055974 | A1 | 3/2018 |
| WO | 2018203454 | A1 | 11/2018 |

* cited by examiner (a)

(b)

QUARTZ GLASS CRUCIBLE WITH CRYSTALLIZATION-ACCELERATOR-CONTAINING LAYER HAVING GRADIENT CONCENTRATION

CROSS-REFERENCE TO RELATED APPLICATIONS

This application is the U.S. National Phase under 35 U.S.C. § 371 of International Application PCT/JP2020/040831, filed Oct. 30, 2020, which claims priority to Japanese Patent Application No. JP2020-002812, filed Jan. 10, 2020. The International Application was published under PCT Article 21(2) in a language other than English.

TECHNICAL FIELD

The present invention relates to a quartz glass crucible, more particularly a quartz glass crucible used for manufacturing a silicon single crystal by the Czochralski (CZ) method.

BACKGROUND ART

A quartz glass crucible is used for manufacturing a silicon single crystal by the CZ method. In the CZ method, a silicon raw material is heated and melted in the quartz glass crucible, followed by immersing of a seed crystal into the obtained silicon melt, and the seed crystal is gradually pulled up while the crucible is being rotated to grow a single crystal. To manufacture a high-quality silicon single crystal for a semiconductor device at low cost, it is necessary not only to increase the single crystal yield in one pulling-up process but also to, for some types, perform so-called multi-pulling in which a plurality of silicon single crystal ingots is pulled up from one crucible. To this end, required is a crucible having a stable shape and being capable of withstanding long-term use.

The conventional quartz glass crucible becomes low in viscosity under a high temperature of 1400° C. or higher during the pulling-up process of a silicon single crystal. Then, the crucible cannot retain its shape, and undergoes deformation such as sagging or collapse to the inside, which may cause problems such as fluctuation in the melt surface level of a silicon melt, breakage of the crucible, and contact with components inside a furnace.

To solve such problems, proposed is a method of enhancing the strength of the crucible by actively crystallizing the wall surface of the crucible. For example, Patent Literature 1 describes a quartz crucible for pulling up a single crystal which contains therein a melt of a single crystal raw material, and which is covered at its outside with a graphite crucible, wherein a coating film containing a cristobalitization accelerator is formed on the outer surface of a protruding part of the quartz crucible protruding upward from the upper end of the graphite crucible so as to reduce thermal deformation of the protruding part.

Patent Literature 2 describes a quartz glass crucible in which a crystallization-accelerator-containing coating film is formed on the outer surface thereof. This quartz glass crucible has a bottomed cylindrical crucible body formed of quartz glass, and a crystallization-accelerator-containing coating film formed on the outer surface of the crucible body so that an outer crystalline layer consisting of masses of dome- or column-shaped crystal grains is formed on the surface layer portion of the outer surface of the crucible body by heating during a pulling up process. The crystallization accelerator contained in the crystallization-accelerator-containing coating film is barium, and the concentration of barium at the outer surface of the crucible body is less than $4.9 \times 10^{15}$ to $3.9 \times 10^{16}$ (atoms/cm$^2$).

Patent Literature 3 describes a composite crucible including a mullite crucible body and a crystallization-accelerator coating formed by applying or spraying a crystallization accelerator on the outer surface of the crucible body.

Patent Literature 4 describes a quartz crucible for growing a single crystal having, on the inner surface thereof, a devitrification-accelerator-adhering layer or a devitrification-accelerator-containing layer. In the quartz crucible, the concentration of the devitrification accelerator at the bottom inner surface of the crucible is made higher than that at the side wall portion and corner portion to adjust crystallization rate for each site. This prevents dislocation in a single crystal occurring due to peeling off of cristobalite from the crucible inner surface.

Patent Literature 5 describes a quartz crucible in which a coating film or a solid solution layer of a crystallization accelerator is present in the inner surface of the quartz crucible within a depth of 1 mm therefrom, and the concentration of the crystallization accelerator is $7.8 \times 10^{14}$ to $3.9 \times 10^{16}$ (atoms/cm$^2$). When a silicon single crystal is pulled up by using this quartz crucible, a crystal layer is formed on the inner surface of the crucible, so that heat resistance property is improved. Therefore, for example, even when a silicon single crystal is pulled up at a reduced pressure, the inner surface does not become rough and is maintained smooth, with the result that pulling up is possible for a long period of time.

BACKGROUND ART LITERATURE

Patent Literature

Patent Literature 1: Japanese Patent Application Laid-Open No. 2005-255488
Patent Literature 2: International Publication No. WO2018/055974 pamphlet
Patent Literature 3: Japanese Patent Application Laid-Open No. 2011-088776
Patent Literature 4: Japanese Patent Application Laid-Open No. 2003-160393
Patent Literature 5: Japanese Patent Application Laid-Open No. H08-002932

SUMMARY OF INVENTION

Problem to be Solved by the Invention

The crystallization accelerator applied to the outer surface of a quartz glass crucible has an effect of actively crystallizing the crucible outer surface to suppress deformation of the crucible. However, when the outer surface is crystallized before the crucible conforms to a carbon susceptor, thereby developing the strength of the crucible, a large gap is generated between the crucible and the susceptor. In this case, the inner diameter of the quartz crucible retaining a silicon melt varies significantly, thus seriously affecting the oxygen concentration of a silicon single crystal grown by the CZ method, or variation in diameter thereof.

Therefore, an object of the present invention is to provide a quartz glass crucible capable of not only enduring a single crystal pulling-up process that takes a very long time, such as multi-pulling, but also stably controlling the oxygen concentration and crystal diameter of a silicon single crystal by eliminating a gap between the carbon susceptor and the crucible as much as possible.

Means for Solving the Problems

To solve the above problem, a quartz glass crucible according to the present invention includes a crucible body made of silica glass and a crystallization-accelerator-containing layer formed on an outer surface of the crucible body, wherein a concentration of a crystallization accelerator contained in the crystallization-accelerator-containing layer is $1.0 \times 10^{13}$ atoms/cm$^2$ or more and $4.8 \times 10^{15}$ atoms/cm$^2$ or less.

According to the present invention, the outer surface of the crucible is crystallized, not too quickly nor too slowly, and develops its strength at an adequate timing. Thus, the crucible can endure a lengthy single crystal pulling-up process, and the oxygen concentration and crystal diameter of a silicon single crystal can be stably controlled by eliminating a gap between the carbon susceptor and the crucible as much as possible.

In the present invention, a thickness of a crystal layer formed on the outer surface when the crucible is heated for 25 hours at a temperature of 1550° C. or higher and 1600° C. or lower is preferably 200 μm or more and 500 μm or less. Thus, the crucible can be crystallized after it is softened under high temperature during a single crystal pulling-up process, to fit the carbon susceptor, thus making it possible to eliminate the gap between the crucible and the carbon susceptor as much as possible to thereby stably control the oxygen concentration and crystal diameter of a silicon single crystal.

In the present invention, the crucible body preferably has a cylindrical side wall portion, a bottom portion, and a corner portion between the side wall portion and the bottom portion, and the crystallization-accelerator-containing layer is preferably formed at least on the side wall portion. In this case, the crystallization-accelerator-containing layer is more preferably formed both on the side wall portion and the corner portion. Forming the crystallization-accelerator-containing layer at least on the side wall portion of the crucible can suppress deformation of the crucible under high temperature during the CZ pulling-up process.

In the present invention, the concentration of the crystallization accelerator on the side wall portion is preferably gradually reduced toward an upper end of the side wall portion from a lower end thereof. The gap between the carbon susceptor and the side wall portion of the crucible tends to be larger at the upper end of the side wall portion. However, by reducing the concentration of the crystallization accelerator from the lower end of the side wall portion toward the upper end thereof, it is possible to delay the strength-developing time at the upper end of the side wall portion, thus making it possible to enhance adhesion with respect to the carbon susceptor.

Effects of the Invention

According to the present invention, what can be provided is a quartz glass crucible capable of not only enduring a single crystal pulling-up process that takes a very long time, such as multi-pulling, but also stably controlling the oxygen concentration and crystal diameter of a silicon single crystal by eliminating a gap between the carbon susceptor and the crucible as much as possible.

MODE FOR CARRYING OUT THE INVENTION

Hereinafter, a preferred embodiment of the present invention will be described in detail with reference to the accompanying drawings.

Figure 1:
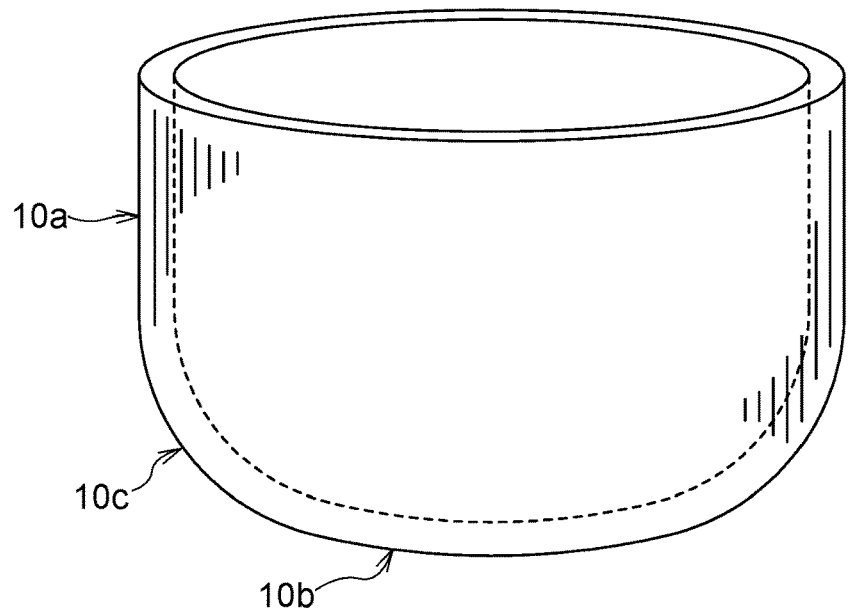
FIG. 1 is a view illustrating a configuration of a quartz glass crucible according to an embodiment of the present invention, in which (a) is a schematic perspective view, and (b) is a schematic cross-sectional side view.
Figure 1:
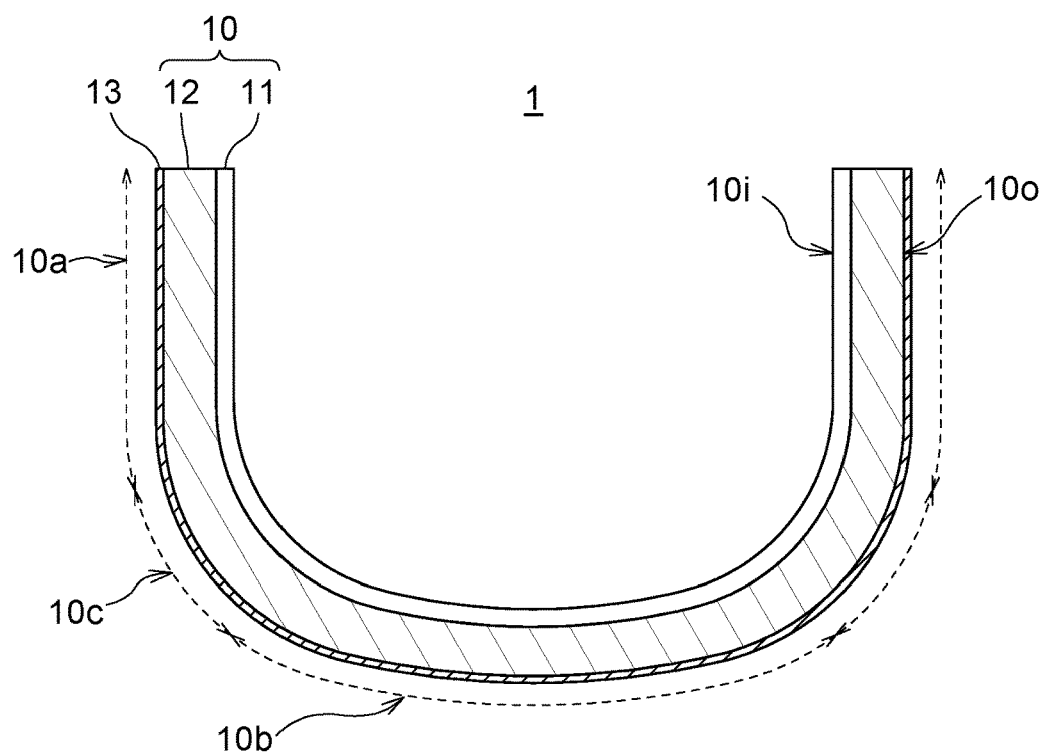

FIG. 1 is a view illustrating a configuration of a quartz glass crucible according to an embodiment of the present invention, in which (a) is a schematic perspective view, and (b) is a schematic cross-sectional side view.

As illustrated in FIGS. 1(*a*) and (*b*), a quartz glass crucible 1 is a silica glass container for supporting a silicon melt and has a cylindrical side wall portion 10*a*, a bottom portion 10*b*, and a corner portion 10*c* formed between the side wall portion 10*a* and the bottom portion 10*b*. The bottom portion 10*b* is preferably a so-called round bottom which is gently curved, but it may be a so-called flat bottom. The corner portion 10*c* is positioned between the side wall portion 10*a* and the bottom portion 10*b* and has a larger curvature than the bottom portion 10*b*. The boundary between the side wall portion 10*a* and the corner portion 10*c* is a position at which the side wall portion 10*a* starts to be curved. The boundary between the corner portion 10*c* and the bottom portion 10*b* is a position at which the large curvature of the corner portion 10*c* starts to be changed to the small curvature of the bottom portion 10*b*.

The aperture (diameter) of the quartz glass crucible 1 is preferably 18 inches (about 450 mm) or more and, more particularly, 32 inches (about 800 mm) or more, although it varies depending on the diameter of a silicon single crystal ingot to be pulled up using the quartz glass crucible 1.

Although the thickness of the quartz glass crucible 1 slightly varies from one portion to another, the thickness of the side wall portion 10*a* of a crucible having a diameter of 18 inches or more is preferably 6 mm or more, and the thickness of the side wall portion 10*a* of a large-sized crucible having a diameter of 32 inches or more is preferably 10 mm or more. This allows a large amount of silicon melt to be stably held under high temperatures.

As illustrated in FIG. 1(*b*), the quartz glass crucible 1 has a crucible body 10 made of silica glass and a crystallization-accelerator-containing layer 13 formed on the outer surface of the crucible body 10. The crucible body 10 includes a transparent layer 11 (bubble-free layer) made of silica glass containing no bubbles, and a bubble layer 12 (opaque layer)

made of silica glass containing a large number of microbubbles and provided outside the transparent layer 11. The crystallization-accelerator-containing layer 13 is formed outside the bubble layer 12.

The transparent layer 11 is a layer constituting an inner surface 10i of the crucible body 10 that contacts a silicon melt and is provided for preventing reduction of the single crystal yield due to the bubbles in the silica glass. The inner surface 10i of the crucible body 10 reacts with the silicon melt to undergo erosion, so that the bubbles in the vicinity of the crucible inner surface cannot be confined within the silica glass. Thus, when the bubbles burst due to thermal expansion, crucible pieces (silica pieces) may peel. When the crucible pieces released into the silicon melt are transported by melt convection to the growth interface of a single crystal to be entrapped in the single crystal, dislocations may be generated in the single crystal. Alternatively, when the bubbles released into the silicon melt float upward to reach the solid/liquid interface and are entrapped in the single crystal, pinholes may be generated in the silicon single crystal.

The phrase "containing no bubbles" in regard to the transparent layer 11 means that it has a bubble content and bubble size to an extent that does not reduce the single crystallization yield. Such bubble content is, for example, 0.1 vol % or less, and the average diameter of the bubbles is preferably 100 μm or less.

The thickness of the transparent layer 11 is preferably 0.5 to 10 mm and is set to an adequate value in this range for each portion of the crucible so as to prevent it from being completely eliminated due to erosion during a single crystal pulling-up process in a manner exposing and the bubble layer 12. The transparent layer 11 is preferably formed over the entire surface of the crucible from the side wall portion 10a to the bottom portion 10b; however, it may be omitted at the upper end of the crucible that does not contact the silicon melt.

The bubble content of the transparent layer 11 and the bubble diameter can be nondestructively measured by using an optical detection means. The optical detection means is provided with a light-receiving device that receives a transmitted light or reflected light of the light irradiated onto the crucible. The light-receiving device may be a digital camera including an optical lens and an imaging element. As the irradiation light, X-rays, laser light, and the like, as well as visible light, ultraviolet light, and infrared light can be used. Measurement results obtained by the optical detection means are input to an image processing unit, where the bubble diameter and the bubble content per unit volume are calculated.

The bubble layer 12 is a layer constituting an outer surface 10o of the crucible body 10, and is provided to enhance the heat retaining property of the silicon melt in the crucible, and to heat the silicon melt in the crucible as uniformly as possible by dispersing radiant heat from a heater provided to surround the crucible in a single crystal pulling-up apparatus. To this end, the bubble layer 12 is formed over the entire surface of the crucible from the side wall portion 10a to the bottom portion 10b of the crucible. The thickness of the bubble layer 12 is approximately equal to a value obtained by subtracting the thickness of the transparent layer 11 from the thickness of the crucible body 10, and varies from one portion to another in the crucible.

The bubble content of the bubble layer 12 is higher than that of the transparent layer 11, and is preferably more than 0.1 vol % and 5 vol % or less. When the bubble content of the bubble layer 12 is 0.1 vol % or less, the bubble layer 12 cannot exhibit the required heat retaining function. In addition, when the bubble content of the bubble layer 12 exceeds 5 vol %, the crucible is deformed due to thermal expansion of the bubbles, so that the single crystal yield may be reduced, and heat conductivity may become insufficient. From the viewpoint of balance between heat retaining property and heat conductivity, the bubble content of the bubble layer 12 is particularly preferably 1 to 4 vol %. A large number of bubbles contained in the bubble layer 12 can be visually confirmed. It should be noted that the above-mentioned bubble content is a value measured for a crucible before use, under room temperature. The bubble content of the bubble layer 12 can be calculated by, for example, specific gravity measurement (Archimedes method) of an opaque silica glass piece cut out from the crucible.

To prevent contamination of the silicon melt, it is desirable that the silica glass constituting the transparent layer 11 has high purity. Therefore, the quartz glass crucible 1 according to the present embodiment preferably has a two-layer structure, a synthetic silica glass layer (synthetic layer) formed from synthetic silica powder, and a natural silica glass layer (natural layer) formed from natural silica powder. The synthetic silica powder can be produced by vapor phase oxidation (dry synthesis method) of silicon tetrachloride ($SiCl_4$), or hydrolysis of silicon alkoxide (Sol-Gel method). Also, the natural silica powder is silica powder produced by pulverizing into particles a natural mineral containing α-quartz as a primary component.

Although details will be described later, the two-layer structure of the synthetic silica glass layer and natural silica glass layer can be produced by depositing the natural silica powder along the inner surface of a mold for producing a crucible, depositing the synthetic silica powder on the deposited natural silica powder, and melting the thus deposited silica powder by using Joule heat of arc discharge. In an initial stage of the arc melting step, strong vacuum drawing is conducted at the outside of the deposition layers of the silica powders to remove bubbles, whereby the transparent layer 11 is formed. Thereafter, the vacuum drawing is stopped or weakened, whereby the bubble layer 12 is formed outside the transparent layer 11. For this reason, although the boundary between the synthetic silica glass layer and the natural silica glass layer does not necessarily coincide with the boundary between the transparent layer 11 and the bubble layer 12; however, like the transparent layer 11, the synthetic silica glass layer preferably has a thickness so as not to be completely eliminated due to erosion of the inner surface of the crucible during the single crystal pulling-up process.

The quartz glass crucible according to the present invention may have a single-layer structure of the natural silica glass layer or synthetic silica glass layer, other than the above-discussed two-layer structure of the synthetic silica glass layer and the natural silica glass layer. The production method for such a quartz glass crucible of the single-layer structure is basically the same as that for a quartz glass crucible of the two-layer structure except for the type of silica powder to be supplied.

The crystallization-accelerator-containing layer 13 is formed on the outer surface of the crucible body 10. The crystallization accelerator contained in the crystallization-accelerator-containing layer 13 accelerates crystallization of the crucible outer surface at a high temperature during a single crystal pulling-up process, so that the strength of the crucible can be enhanced. It should be noted here that, the reason for providing the crystallization-accelerator-containing layer 13 on the outer surface side, not on the inner side, of the quartz glass crucible 1 is as follows. First, when the crystallization-accelerator-containing layer 13 is formed on the crucible inner surface side, there is a high risk of the occurrence of pinholes in the silicon single crystal or peeling between the crucible outer and inner layers; while when the crystallization-accelerator-containing layer 13 is formed on the outer surface side, such a risk can be reduced. Further, when the crystallization-accelerator-containing layer 13 is formed on the inner surface, there is a risk of contamination of a single crystal due to impurity contamination of the crucible inner surface, while impurity contamination of the crucible outer surface is allowed to some extent, so that there is a low risk of contamination of a single crystal when the crystallization-accelerator-containing layer 13 is formed on the crucible outer surface.

Although the crystallization-accelerator-containing layer 13 is formed over the entire surface of the crucible from the side wall portion 10a to the bottom portion 10b in the present embodiment, it may be formed at least on the side wall portion 10a. This is because the side wall portion 10a is more liable to be deformed than the corner portion 10c and bottom portion 10b, so that crystallization of the outer surface on the side wall portion 10a has a high effect of suppressing deformation of the crucible. The crystallization-accelerator-containing layer 13 is preferably formed not only on the side wall portion 10a but also on the corner portion 10c. The crystallization-accelerator-containing layer 13 may be formed or not formed on the bottom portion 10b of the crucible. This is because the crucible bottom portion 10b receives the weight of a large amount of silicon melt and thus easily fits a carbon susceptor, which makes it less likely to generate a gap between the crucible and the carbon susceptor.

A rim upper end which is a part of the outer surface of the crucible side wall portion 10a in the range of 1 to 3 cm downward from the rim upper end may be set as a non-forming area of a crystallization-accelerator-containing layer. This can suppress crystallization of the rim upper end surface to prevent the occurrence of dislocation in a single crystal due to mixing of crystal pieces peeled off from the rim upper surface into the melt.

The crystallization accelerator contained in the crystallization-accelerator-containing layer 13 is a group 2 element, and examples thereof include magnesium (Mg), calcium (Ca), strontium (Sr), barium (Ba), and radium (Ra), and the like. Among them, barium is particularly preferable because it is smaller in segregation coefficient than silicon, stable at normal temperature, and easily handled. Further, barium does not attenuate in crystallization rate with crystallization, and causes strong orientation growth compared with other elements. The crystallization accelerator is not limited to the group 2 element, and may be lithium (Li), zinc (Zn), lead (Pb), aluminum (Al), or the like.

The concentration of the crystallization accelerator contained in the crystallization-accelerator-containing layer 13 is preferably $1.0 \times 10^{13}$ atoms/cm$^2$ or more and $4.8 \times 10^{15}$ atoms/cm$^2$ or less and, more preferably, $0.6 \times 10^{15}$ atoms/cm$^2$ or more and $2.0 \times 10^{15}$ atoms/cm$^2$ or less. When the concentration of the crystallization accelerator is set to a very high value of, for example, $1.0 \times 10^{17}$ atoms/cm$^2$ or more as in the conventional way, the action of the crystallization accelerator is excessively strong to develop the strength of the crucible in a short time after heating, which makes it difficult for the crucible to fit the carbon susceptor, with the result that a gap is likely to occur between the crucible and the carbon susceptor. On the other hand, when the concentration of the crystallization accelerator is lower than $1.0 \times 10^{13}$ atoms/cm$^2$, the action of the crystallization accelerator is excessively weak, so that a satisfactory strength of the crucible due to crystallization cannot be obtained, which may cause deformation of the crucible. However, when the concentration of the crystallization accelerator is set to $4.8 \times 10^{15}$ atoms/cm$^2$ or less as in the present invention, the strength can be developed at an adequate time after the elapse of a predetermined period of time from the completion of heating, allowing the crucible to fit the carbon susceptor.

The concentration of the crystallization accelerator contained in the crystallization-accelerator-containing layer 13 is preferably gradually (or stepwise) reduced upward along the crucible. Thus, the strength-developing time can be made longer toward the crucible upper end. The carbon susceptor is gradually worn at its upper end in repetitive use, resulting in being shaped to open outward, and thus a gap from the carbon susceptor is more likely to be generated at the crucible upper end. By delaying the crystallization of the crucible upper end, instead of crystallizing the entire crucible from the upper and lower ends simultaneously, it is possible to increase the time for the crucible upper end to conform to the carbon susceptor.

When the quartz glass crucible 1 according to the present embodiment is heated for 25 hours at a temperature of 1550° C. or higher and 1600° C. or lower, the thickness of a crystal layer formed on the crucible outer surface is preferably 200 µm or more and 500 µm or less. When the thickness of the crystal layer after the elapse of 25 hours from the start of a single crystal pulling-up process is less than 200 µm, the probability that the crucible is deformed becomes high due to lack of strength. Also, when the thickness of the crystal layer is more than 500 µm, adhesion between the crucible and the carbon susceptor gets worse. As a result, heat conductivity between the carbon susceptor and the quartz glass crucible fluctuates during the pulling-up process to adversely affect the control of the oxygen concentration or crystal diameter of a silicon single crystal. Further, when the thickness of the crystal layer is excessively large, the crystal layer may foam and peel off to adversely affect the single crystal pulling-up process. However, when the thickness of the crystal layer falls within the above range, strength can be developed after the crucible has fitted to the carbon susceptor, making it possible to stably control the oxygen concentration and crystal diameter of a silicon single crystal.

The crystallization rate of the quartz glass crucible 1 varies depending on the atmosphere or pressure in a furnace. Typically, as crystal pulling-up conditions, an in-furnace atmosphere is an inert gas atmosphere such as argon gas, and an in-furnace pressure is 10 to 100 Torr. However, if the thickness of the crystal layer formed on the crucible outer surface is 200 µm or more and 500 µm or less, when heating at a temperature of not less than 1550° C. and not more than 1600° C. for 25 hours, the same effects can be obtained even when the crystal pulling-up conditions are outside the above range.

The quartz glass crucible 1 according to the present embodiment may be a so-called outward-opening crucible with the upper end of the side wall portion 10a opening outward. The outward-opening crucible has a shape in which the inner diameter of the upper end of the side wall portion 10a is larger than the inner diameter of the lower end thereof, or a shape in which the outer diameter of the upper end of the side wall portion 10a of the outward-opening crucible is larger than the outer diameter of the lower end thereof. As described above, the carbon susceptor is gradually worn by repetitive use, which makes the inner surface of the carbon susceptor likely to have an outward-opening shape, so that when an ordinary crucible is used, a gap from the carbon susceptor is more likely to be generated at the crucible upper end. However, when the quartz glass crucible 1 has the outward opening shape, the gap between the crucible upper end and the carbon susceptor can be reduced in advance. In addition, by delaying crystallization of the side wall portion 10a, adhesion between the crucible upper end and the carbon susceptor can be enhanced, and, accordingly, by eliminating the gap between the crucible and the carbon susceptor as much as possible, the oxygen concentration and crystal diameter of a silicon single crystal can stably be controlled.

Figure 2:
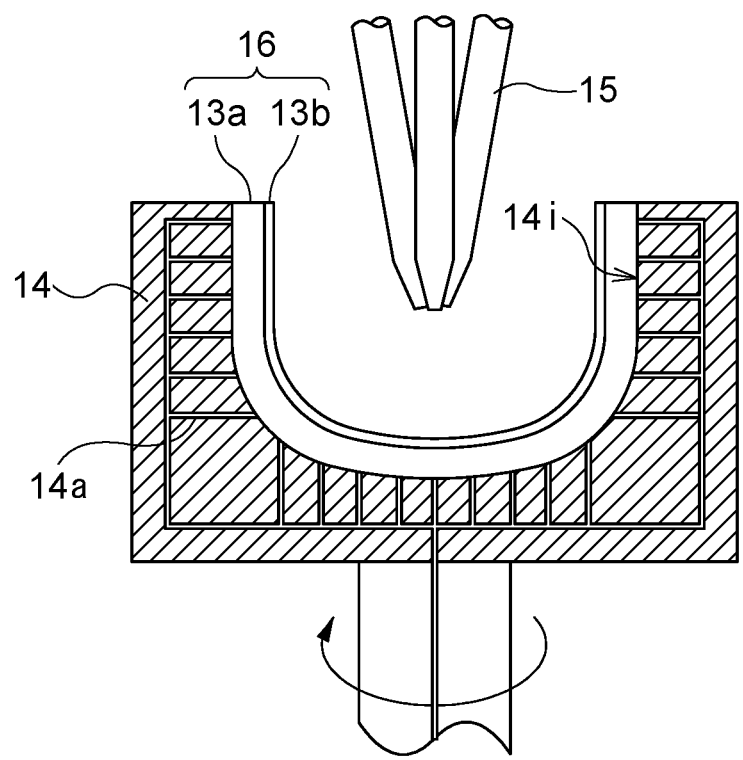
FIG. 2 is a schematic view for explaining a manufacturing method for the quartz glass crucible, and particularly a view showing a manufacturing method of the crucible body by rotating mold method.
Figure 3:
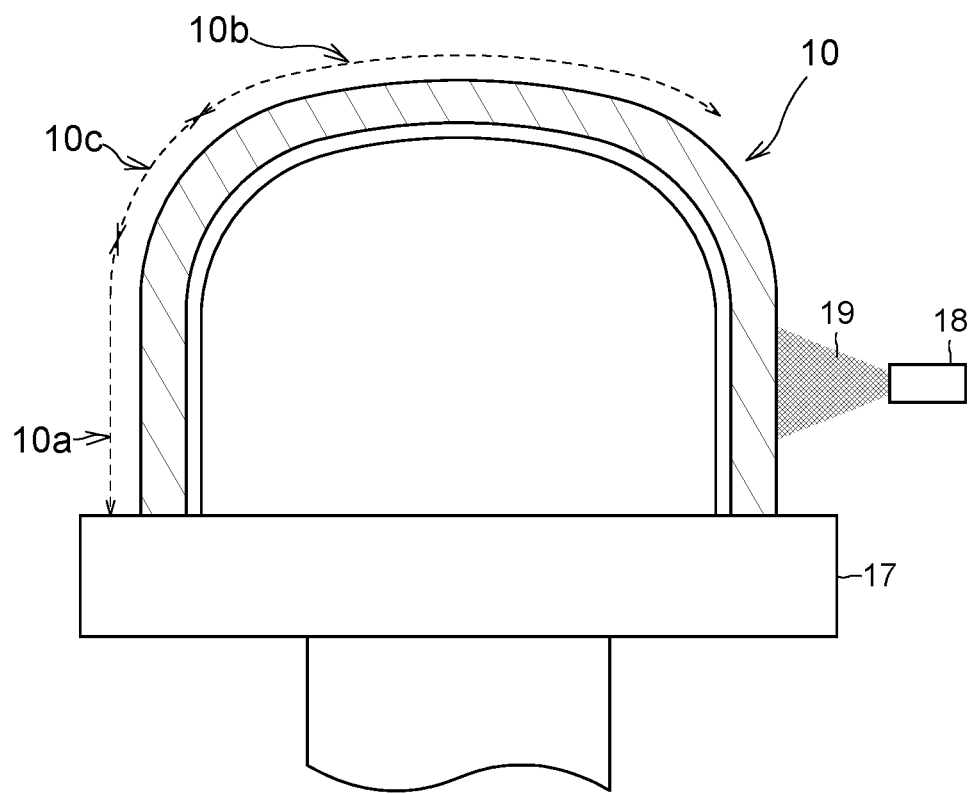
FIG. 3 is a schematic view for explaining a manufacturing method for the quartz glass crucible, and particularly a view showing an example of forming a crystallization-accelerator-containing layer.

FIG. 2 and FIG. 3 are schematic views for explaining a manufacturing method for the quartz glass crucible 1.

As illustrated in FIG. 2, the crucible body 10 of the quartz glass crucible 1 is manufactured by the so-called rotating mold method. In the rotating mold method, a mold 14 having a cavity conforming to the crucible outer diameter is prepared, and natural silica powder 13a and synthetic silica powder 13b are sequentially deposited along an inner surface 14i of the rotating mold 14 to form a deposited layer 16 of raw material silica powder. The raw material silica powder is retained in a certain position of the inner surface 14i of the mold 14 by the centrifugal force, maintaining its crucible shape.

Then, arc electrodes 15 are placed in the mold, and the deposited layer 16 of the raw material silica powder is arc-melted from the inner side of the mold 14. Specific conditions such as heating time and heating temperature are determined as appropriate by considering conditions such as properties of the raw material silica powder, and size of the crucible.

During arc melting, the deposited layer 16 of the raw material silica powder is vacuum-drawn through many vent holes 14a formed in the inner surface 14i of the mold 14 to control the amount of bubbles in the melted silica glass. Specifically, decompression applied to the raw material silica powder is enhanced at the start time of arc melting to form the transparent layer 11, and then the decompression is reduced after the formation of the transparent layer 11 to form the bubble layer 12. The decompression force for forming the transparent layer 11 is preferably −70 to −95 kPa, and the decompression force for forming the bubble layer 12 is preferably atmospheric pressure to −35 kPa.

The arc heat is gradually transmitted outward from the inner side of the deposited layer 16 of the raw material silica powder to melt the raw material silica powder, so that by changing decompression conditions at the timing at which the raw material silica powder starts melting, the transparent layer 11 and the bubble layer 12 can be separately formed. That is, when decompression melting is performed to enhance decompression at the timing at which the silica powder melt, the arc atmosphere gas is not confined in the glass, and silica glass containing no bubbles is formed. In addition, when normal melting (atmospheric-pressure melting) is performed to reduce decompression at the timing at which the silica powder is melted, the arc atmosphere gas is confined in the glass, thereby forming silica glass containing a large number of bubbles.

Thereafter, the arc melting is ended, and the crucible is cooled down, whereby the crucible body 10 made of silica glass in which the transparent layer 11 and bubble layer 12 are sequentially provided from the inside toward the outside of the crucible wall is completed.

Then, as shown in FIG. 3, the crystallization-accelerator-containing layer 13 is formed on the outer surface of the crucible body 10. The crystallization-accelerator-containing layer 13 can be formed by, for example, spraying crystallization-accelerator-containing coating liquid 19 to the outer surface of the crucible body 10. Alternatively, by using a brush, the crystallization-accelerator-containing coating liquid may be applied to the outer surface of the crucible body 10. When the crystallization accelerator is barium, a solution containing barium hydroxide, barium sulphate, or barium carbonate may be used. Further, when the crystallization accelerator is aluminum, the crucible can be formed by using raw material quartz powder with the crystallization accelerator added thereto.

In forming the crystallization-accelerator-containing layer 13 on the outer surface of the crucible body 10, the crucible body 10 is placed on a rotary stage 17 with the opening of the crucible body 10 facing downward. Then, while the crucible body 10 is being rotated, the crystallization-accelerator-containing coating liquid 19 is applied onto the outer surface of the crucible body 10 using a spraying device 18. To change the concentration of the crystallization accelerator contained in the crystallization-accelerator-containing layer 13, the concentration of the crystallization accelerator in the crystallization-accelerator-containing coating liquid is adjusted.

For providing a concentration gradient to the crystallization-accelerator-containing layer 13, application time of the crystallization-accelerator-containing coating liquid 19 (the number of times of recoating of the crystallization accelerator) may be changed. For example, the crystallization-accelerator-containing coating liquid 19 is applied to the upper portion of the side wall portion 10a by an amount corresponding to one rotation, to the middle portion of the side wall portion 10a by an amount corresponding to two rotations, to the lower portion of the side wall portion 10a by an amount corresponding to three rotations, and to the corner portion 10c and bottom portion 10b by an amount corresponding to four rotations, whereby the concentration of the crystallization accelerator in the crystallization-accelerator-containing layer 13 can be reduced toward the upper end of the crucible.

Figure 4:
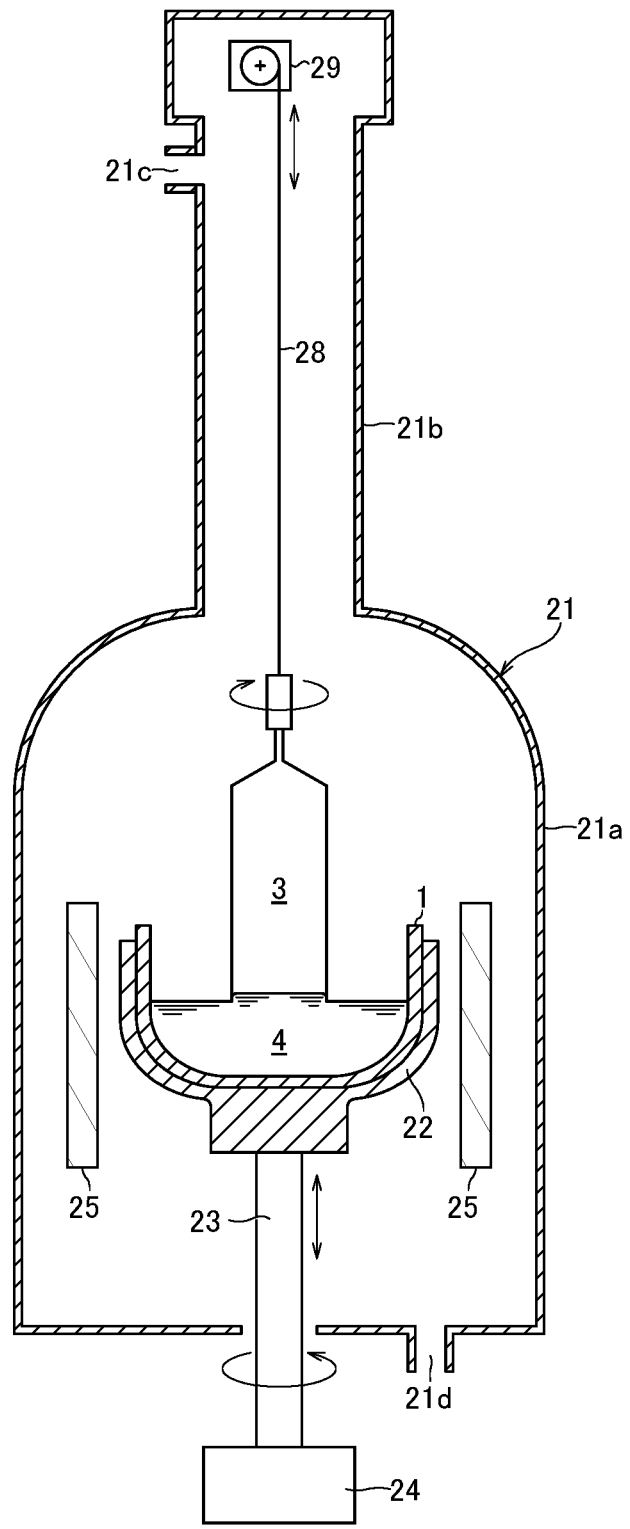
FIG. 4 is a view explaining a single crystal pulling-up process using a quartz glass crucible according to the embodiment of the present invention, which is a schematic cross-sectional view illustrating the configuration of a single crystal pulling-up unit.

FIG. 4 is a diagram for explaining a single crystal pulling-up process using the quartz glass crucible 1 according to the present embodiment, and is a schematic cross-sectional view illustrating the configuration of a single crystal pulling-up unit.

As illustrated in FIG. 4, a single crystal pulling-up unit 20 is used for a silicon single crystal pulling-up process according to the CZ method. The single crystal pulling-up unit 20 includes a water-cooled type chamber 21, the quartz glass crucible 1 retaining a silicon melt in the chamber 21, a carbon susceptor 22 holding the quartz glass crucible 1, a rotary shaft 23 supporting the carbon susceptor 22 so as to be able to rotate and move up/down the carbon susceptor 22, a shaft driving mechanism 24 for rotating and moving up/down the rotary shaft 23, a heater 25 disposed around the carbon susceptor 22, a crystal pull-up wire 28 disposed above the quartz glass crucible 1 so as to be coaxial with the rotary shaft 23, and a wire winding mechanism 29 disposed at the upper portion of the chamber 21.

The chamber 21 is constituted by a main chamber 21a and an elongated cylindrical pull chamber 21b connected to the upper opening of the main chamber 21a. The quartz glass crucible 1, carbon susceptor 22, and heater 25 are provided in the main chamber 21a. A gas inlet port 21c for introducing inert gas (purge gas) such as argon gas or dopant gas into the main chamber 21a is provided in the upper portion of the pull chamber 21b, and a gas exhaust port 21d for exhausting the atmospheric gas in the main chamber 21a is provided at the lower portion of the main chamber 21a.

The carbon susceptor 22 is used for maintaining the shape of the quartz glass crucible 1 which is softened under high temperature, and surrounds and holds the quartz glass crucible 1. The quartz glass crucible 1 and carbon susceptor 22 constitute a double-structured crucible that supports the silicon melt in the chamber 21.

The carbon susceptor 22 is fixed to the upper end of the rotary shaft 23, and the lower end of the rotary shaft 23 passes through the bottom of the chamber 21 and is connected to the shaft driving mechanism 24 provided outside the chamber 21.

The heater 25 is used for generating the silicon melt 4 by melting a polycrystalline silicon raw material filled in the quartz glass crucible 1, as well as for maintaining the molten state of the silicon melt 4. The heater 25 is a carbon heater of a resistance heating type and is provided so as to surround the quartz glass crucible 1 in the carbon susceptor 22.

While the amount of the silicon melt in the quartz glass crucible 1 decreases as the silicon single crystal 3 grows, the quartz glass crucible 1 is pulled up so as to maintain the height of the melt surface at a fixed level.

The wire winding mechanism 29 is provided at the top of the pull chamber 21b, and the wire 28 extends downward from the wire winding mechanism 29 through the pull chamber 21b, and the tip end of the wire 28 reaches the internal space of the main chamber 21a. This figure illustrates a state where the silicon single crystal 3 during growing is suspended by the wire 28. During the pulling-up of the silicon single crystal 3, the silicon single crystal 3 is grown by gradually pulling up the wire 28 while rotating each of the quartz glass crucible 1 and the silicon single crystal 3.

Although the quartz glass crucible 1 is softened during the single crystal pulling-up process, crystallization of the outer surface proceeds due to the action of the crystallization accelerator applied to the crucible outer surface, so that the strength of the crucible can be maintained to suppress deformation thereof. Therefore, it is possible to prevent the crucible from being deformed and coming into contact with the members in the furnace and to prevent variations in the liquid surface position of the silicon melt 4 due to a change in the internal volume of the crucible. Further, in the present embodiment, the concentration of the crystallization accelerator is adjusted so as to advance crystallization of the crucible outer surface relatively slowly. Thus, the crucible outer surface can be crystallized after the crucible is softened to fit the carbon susceptor 22, thus making it possible to eliminate the gap between the crucible and the carbon susceptor as much as possible to thereby stably support the crucible.

Figure 5:
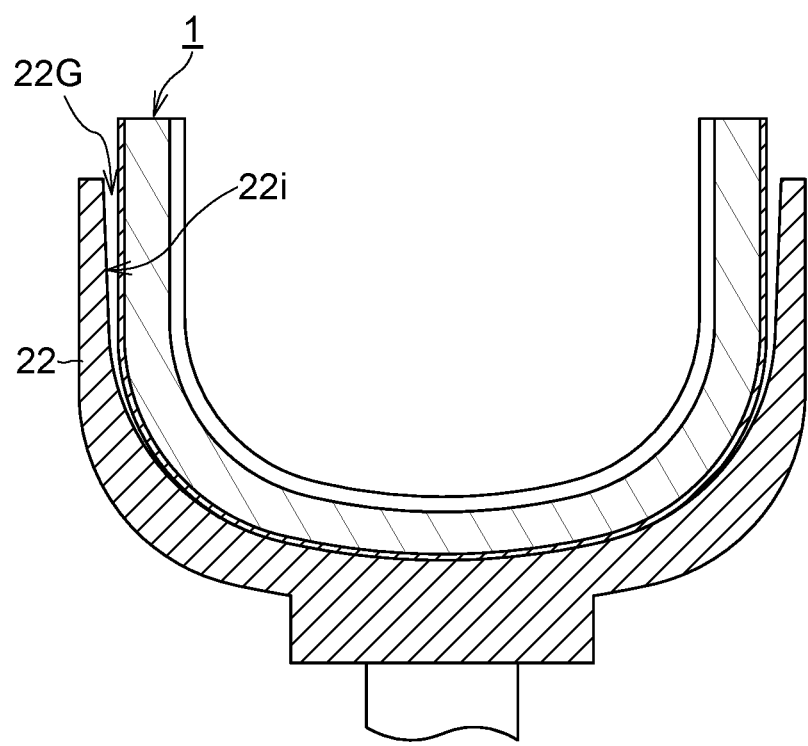
FIG. 5 is a schematic cross-sectional side view illustrating the relation between the carbon susceptor and the quartz glass crucible.

FIG. 5 is a schematic cross-sectional side view illustrating the relation between the carbon susceptor 22 and the quartz glass crucible 1.

As illustrated in FIG. 5, the carbon susceptor 22 is repeatedly used in the CZ pulling-up process and therefore gradually worn, which makes an inner surface 22i of the carbon susceptor 22 likely to have an outward opening shape, so that a gap 22G is more likely to be generated between the outer surface of the quartz glass crucible 1 and the inner surface 22i of the carbon susceptor 22. When the crucible outer surface is crystallized to develop the strength of the crucible in a state where the gap 22G exists, heat conductivity between the carbon susceptor 22 and the quartz glass crucible 1 fluctuates during the pulling-up process or from one pulling-up process to another to adversely affect the control of the oxygen concentration or crystal diameter of a silicon single crystal. In particular, when the crucible has an outer surface tolerance exceeding −10 mm (i.e., less than −10 mm), adhesion between the crucible and the carbon susceptor deteriorates, which significantly affects quality such as oxygen concentration of a silico single crystal, associated with a change in the infrared change rate.

However, when the crucible outer surface is crystalized not too quickly or too slowly, and develops its strength at an adequate timing, the crucible can not only endure a lengthy single crystal pulling-up process but also fit the carbon susceptor to thereby eliminate the gap 22G between the carbon susceptor 22 and the quartz glass crucible 1 as much as possible. Further, when the quartz glass crucible 1 has the above-mentioned outward-opening shape and has an outer surface tolerance of −2 mm to −10 mm, adhesion with respect to the carbon susceptor 22 can be further enhanced, thus making it possible to stably control the oxygen concentration and crystal diameter of a silicon single crystal.

As described above, the quartz glass crucible 1 according to the present embodiment includes the crucible body 10 made of silica glass and the crystallization-accelerator-containing layer formed on the outer surface of the crucible body 10, wherein the concentration of the crystallization accelerator contained in the crystallization-accelerator-containing layer is $1.0 \times 10^{13}$ atoms/cm$^2$ or more and $4.8 \times 10^{15}$ atoms/cm$^2$ or less, so that the crucible outer surface can be crystallized by the action of the crystallization accelerator at an appropriate timing, neither too early nor too late, after the elapse of a certain period of time from the start of the single crystal pulling-up process. Thus, it is possible to maintain strength that can endure a single crystal pulling-up process that takes a very long time, such as multi-pulling, by eliminating the gap between the carbon susceptor and the crucible as much as possible thereby to stably control the oxygen concentration and crystal diameter of a silicon single crystal.

While the preferred embodiment of the present invention has been described above, the present invention is not limited to the above embodiment, and various modifications may be made within the scope of the present invention, and all such modifications are included in the present invention.

In the above embodiment, for example, the crystallization-accelerator-containing layer 13 is configured by forming a crystallization-accelerator-containing coating film on the outer surface of the crucible body 10. The crystallization-accelerator-containing layer 13, however, may take any form without particular limitation; for example, it can be configured by forming a solid solution layer of a crystallization accelerator in a silica glass matrix.

EXAMPLES

Samples A1 to A8 (Comparative Examples A1, A2, A8, and Examples A3 to A7) of crucible bodies of unused quartz glass crucibles of the same type were prepared, and coating liquid containing a barium compound was applied to the outer surface of each crucible body to form a crystallization-accelerator-containing layer. Thereafter, a part of the crystallization-accelerator-containing layer on the outer surface of each crucible was removed, and Ba concentration was measured by ICP-MS (Inductively Coupled Plasma-Mass Spectrometry). The results are shown in Table 1.

Further, each crucible sample was heated at 1580° C. in an argon gas atmosphere of 20 Torr for 25 hours, and the thickness of a crystal layer formed on the crucible outer surface was measured. It should be noted that the temperature rising rate during the heating process was 300° C./h. Also, a microscope was used for the measurement of the crystal layer thickness. As a result, as shown in Table 1, the Ba concentration of Comparative Example A1 was $1.3 \times 10^{17}$ (atoms/cm$^2$), the Ba concentration of Comparative Example A2 was $5.0 \times 10^{15}$ (atoms/cm$^2$), the Ba concentration of Example A3 was $4.8 \times 10^{15}$ (atoms/cm$^2$), the Ba concentration of Example A4 was $2.0 \times 10^{15}$ (atoms/cm$^2$), the Ba concentration of Example A5 was $1.3 \times 10^{15}$ (atoms/cm$^2$), the Ba concentration of Example A6 was $0.6 \times 10^{15}$ (atoms/cm$^2$), the Ba concentration of Example A7 was $1.0 \times 10^{13}$ (atoms/cm$^2$), and the Ba concentration of Comparative Example A8 was $9.0 \times 10^{12}$ (atoms/cm$^2$).

Also, the thickness of the crystal layer of Comparative Example A1 was 800 µm, the thickness of the crystal layer of Comparative Example A2 was 550 µm, the thickness of the crystal layer of Example A3 was 500 µm, the thickness of the crystal layer of Example A4 was 350 µm, the thickness of the crystal layer of Example A5 was 300 µm, the thickness of the crystal layer of Example A6 was 300 µm, the thickness of the crystal layer of Example A7 was 200 µm, and the thickness of the crystal layer of Comparative Example A8 was 180 µm.

TABLE 1

| Crucible sample | Ba concentration (atoms/cm$^2$) | Crystal layer thickness (µm) after elapse of 25 hours |
|---|---|---|
| A1 (Comp. Ex.) | $1.3 \times 10^{17}$ | 800 |
| A2 (Comp. Ex.) | $5.0 \times 10^{15}$ | 550 |
| A3 (Ex.) | $4.8 \times 10^{15}$ | 500 |
| A4 (Ex.) | $2.0 \times 10^{15}$ | 350 |
| A5 (Ex.) | $1.3 \times 10^{15}$ | 300 |
| A6 (Ex.) | $0.6 \times 10^{15}$ | 300 |
| A7 (Ex.) | $1.0 \times 10^{13}$ | 200 |
| A8 (Comp. Ex.) | $9.0 \times 10^{12}$ | 180 |

Thus, it was found that the higher the Ba concentration, the higher the crystallization rate of the outer surface of the quartz glass crucible and that when the Ba concentration was equal to or less than $4.8 \times 10^{15}$ atoms/cm$^2$, the thickness of the crystal layer after the elapse of 25 hours from the start of heating was 500 µm or less (crystallization rate: 20 µm/h).

Then, Samples B1 to B8 (Comparative Examples B1, B2, B8, and Examples B3 to B7) of unused quartz glass crucibles of the same type as the samples A1 to A8 having crystallization-accelerator-containing layers with the same Ba concentrations as those of samples A1 to A8, respectively, were used to pull up a silicon single crystal according to the CZ method. After completion of the single crystal pulling-up process, deformation of the quartz glass crucible was visually observed, and the maximum value of a gap between the quartz glass crucible and the carbon susceptor was measured. Further, the oxygen concentration and crystal diameter of a silicon single crystal ingot were evaluated. The results are shown in Table 2.

TABLE 2

| | | | Pulling-up result (Target crystal position: Middle part) | | |
|---|---|---|---|---|---|
| Crucible sample | Ba concentration (atoms/cm$^2$) | Gap between crucible and carbon susceptor (mm) | Deviation extent from target oxygen concentration | Deviation extent from target diameter | Crucible deformation |
| B1 (comp. Ex.) | $1.3 \times 10^{17}$ | 6 | Large | Large | None |
| B2 (comp. Ex.) | $5.0 \times 10^{15}$ | 6 | Large | Large | None |
| B3 (Ex.) | $4.8 \times 10^{15}$ | 4 | Middle | Middle | None |
| B4 (Ex.) | $2.0 \times 10^{15}$ | 0 | Small | Small | None |
| B5 (Ex.) | $1.3 \times 10^{15}$ | 0 | Small | Small | None |
| B6 (Ex.) | $0.6 \times 10^{15}$ | 0 | Small | Small | None |
| B7 (Ex.) | $1.0 \times 10^{13}$ | 0 | Middle | Middle | Small |
| B8 (comp. Ex.) | $9.0 \times 10^{12}$ | 0 | Impossible to pull up | Impossible to pull up | Large (impossible to pull up) |

In Comparative examples B1 and B2, the gap between the crucible and the carbon susceptor was as large as 6 mm, and deviations from the target values of the oxygen concentration and crystal diameter were large; however, no deformation of the crucible was observed.

In Example B3, the gap between the crucible and the carbon susceptor was slightly large, which was 4 mm, and deviations of the oxygen concentration and crystal diameter were also slightly large; however, no deformation of the crucible was observed, and satisfactory results were obtained as a whole. In Examples B4, B5, and B6, there was no gap between the crucible and the carbon susceptor, deviations of the oxygen concentration and crystal diameter were small, and no deformation of the crucible was observed, and satisfactory results were obtained.

In Example B5, although there was no gap between the crucible and the carbon susceptor, deviations of the oxygen concentration and crystal diameter were slightly large, and slight deformation of the crucible was observed; however, satisfactory results were obtained as a whole. On the other hand, in Comparative Example B8, although there was no gap between the crucible and the carbon susceptor, large deformation of the crucible was observed, which made it difficult to control the crystal pulling-up, resulting in suspension of the single crystal pulling-up process.

Then, Sample B9 (Example B9) of a quartz glass crucible having a crystallization-accelerator-containing layer in which the Ba concentration thereof was varied in the height direction was prepared, and the Ba concentration was measured. The Ba concentration at the lower end of the side wall portion was $4.0 \times 10^{15}$ (atoms/cm$_2$), and Ba concentration at a position (position in the vicinity of the upper end of the side wall portion) lower by 1 cm than the rim upper end of the side wall portion was $2.0 \times 10^{13}$ (atoms/cm$_2$). The area from the rim upper end of the side wall portion to a position lower by 1 cm than the rim upper end was set as a non-forming area of a crystallization-accelerator-containing layer. Sample B9 was a quartz glass crucible of the same type as those of Samples B1 to B8 except for the Ba concentration.

Thereafter, crucible Sample B9 was used to pull up a silicon single crystal according to the CZ method. After completion of the single crystal pulling-up process, deformation of crucible Sample B9 was visually observed, and the maximum value of a gap between the quartz glass crucible and the carbon susceptor was measured. Further, the oxygen concentration and crystal diameter of a silicon single crystal ingot were evaluated. The evaluation results of the crucible sample B9 are shown in Table 3.

TABLE 3

| Crucible sample | Ba concentration (atoms/cm$^2$) | Deviation amount from target oxygen concentration | Deviation amount from target diameter | Adhesion between crucible and carbon susceptor |
|---|---|---|---|---|
| B4 (Ex.) | 1.30 × 10$^{15}$ uniform | Small | Small | High |
| B9 (Ex.) | Lower end of side wall portion: 4.0 × 10$^{15}$ Vicinity of upper end of side wall portion: 2.0 × 10$^{13}$ | Extremely small | Extremely small | Very high |

In Sample B9, deviations from the target values of the oxygen concentration and crystal diameter were smaller than those in crucible Sample B5 having satisfactory results. Further, there was observed no deformation of the crucible such as inward sagging. In addition, there was no gap between the crucible and the carbon susceptor, and adhesion therebetween was very high.

EXPLANATION OF SYMBOLS

1: Quartz crucible
3: Silicon single crystal
4: Silicon melt
10: Crucible body
10a: Side wall portion
10b: Bottom portion
10c: Corner portion
10i: Inner surface of crucible body
10o: Outer surface of crucible body
11: Transparent layer
12: Bubble layer
13: Crystallization-accelerator-containing layer
13a: Natural silica powder
13b: Synthetic silica powder
14: Mold
14a: Mold vent hole
14i: Mold inner surface
15: Arc electrode
16: Deposited layer of raw material silica powder
17: Rotary stage
18: Spraying device
19: Crystallization-accelerator-containing coating liquid
20: Single crystal pulling-up unit
21: Chamber
21a: Main chamber
21b: Pull chamber
21c: Gas inlet port
21d: Gas exhaust port
22: Carbon susceptor
23: Rotary shaft
24: Shaft driving mechanism
25: Heater
28: Single crystal pull-up wire
29: Wire winding mechanism

What is claimed:

1. A quartz glass crucible comprising:
a crucible body made of silica glass; and
a crystallization-accelerator-containing layer formed on an outer surface of the crucible body, wherein
the crucible body has a cylindrical side wall portion, a bottom portion, and a corner portion between the side wall portion and the bottom portion,
the crystallization-accelerator-containing layer is formed at least on the side wall portion from a lower part extending to an upper part thereof,
a concentration of a crystallization accelerator contained in the crystallization-accelerator-containing layer is 1.0×10$^{13}$ atoms/cm$^2$ or more and 4.8×10$^{15}$ atoms/cm$^2$ or less, and
the concentration of the crystallization accelerator on the side wall portion decreases from the lower part toward the upper part of the side wall portion.

2. The quartz glass crucible according to claim 1, wherein the crystallization-accelerator-containing layer accelerates formation of a crystal layer on the outer surface and is absorbed in the crystal layer when the crucible is heated, wherein a thickness of the crystal layer is 200 μm or more and 500 μm or less as measured when heated at a temperature of 1550° C. or higher and 1600° C. or lower for 25 h.

3. The quartz glass crucible according to claim 1, wherein the crystallization-accelerator-containing layer is formed both on the side wall portion and the corner portion.

4. The quartz glass crucible according to claim 2, wherein the crystallization-accelerator-containing layer is formed both on the side wall portion and the corner portion.

5. The quartz glass crucible according to claim 1, wherein a concentration of the crystallization-accelerator provided to a lower portion of the side wall portion is higher than a concentration of the crystallization-accelerator provided to a middle portion of the side wall portion, and
the concentration of the crystallization-accelerator provided to the middle portion of the side wall portion is higher than a concentration of the crystallization-accelerator provided to an upper portion of the side wall portion.

6. The quartz glass crucible according to claim 3, wherein a concentration of the crystallization-accelerator provided to the corner portion is higher than a concentration of the crystallization-accelerator provided to a lower portion of the side wall portion,
the concentration of the crystallization-accelerator provided to the lower portion of the side wall portion is higher than a concentration of the crystallization-accelerator provided to a middle portion of the side wall portion,
the concentration of the crystallization-accelerator applied to the middle portion of the side wall portion is higher than a concentration of the crystallization-accelerator provided to an upper portion of the side wall portion.

7. The quartz glass crucible according to claim 1, wherein no crystallization-accelerator-containing layer is provided on the bottom portion.

8. The quartz glass crucible according to claim 1, wherein the concentration of the crystallization accelerator on the side wall portion decreases from the lower part toward the upper part of the side wall in a continuous manner or multiple stepwise manner.

\* \* \* \* \*